United States Patent
Van Der Schaar et al.

(10) Patent No.: US 7,532,307 B2
(45) Date of Patent: May 12, 2009

(54) FOCUS DETERMINATION METHOD, DEVICE MANUFACTURING METHOD, AND MASK

(75) Inventors: Maurits Van Der Schaar, Veldhoven (NL); Arie Jeffrey Den Boef, Waalre (NL); Mircea Dusa, Campbell, CA (US); Antoine Gaston Marie Kiers, Veldhoven (NL)

(73) Assignee: ASMl Netherlands B.V., Veldhoven (NL)

( * ) Notice: Subject to any disclaimer, the term of this patent is extended or adjusted under 35 U.S.C. 154(b) by 600 days.

(21) Appl. No.: 11/170,747

(22) Filed: Jun. 30, 2005

(65) Prior Publication Data
US 2007/0003840 A1    Jan. 4, 2007

(51) Int. Cl.
G03B 27/52    (2006.01)
G03B 27/42    (2006.01)
G03F 9/00    (2006.01)
G03C 5/00    (2006.01)

(52) U.S. Cl. .............................. 355/55; 355/53; 430/5; 430/30

(58) Field of Classification Search .................. 355/53, 355/55; 356/400, 401, 601, 609, 614, 624; 430/5, 30
See application file for complete search history.

(56) References Cited

U.S. PATENT DOCUMENTS

| | | | |
|---|---|---|---|
| 5,362,585 A | 11/1994 | Adams | 430/30 |
| 5,674,650 A | 10/1997 | Dirksen et al. | 430/22 |
| 5,703,692 A | 12/1997 | McNeil et al. | 356/445 |
| 5,880,838 A | 3/1999 | Marx et al. | 356/351 |
| 5,963,329 A | 10/1999 | Conrad et al. | 356/372 |
| 6,376,139 B1 | 4/2002 | Fujisawa et al. | 430/30 |
| 6,608,690 B2 | 8/2003 | Niu et al. | 356/635 |
| 6,699,624 B2 | 3/2004 | Niu et al. | 430/5 |
| 6,704,661 B1 | 3/2004 | Opsal et al. | 702/27 |
| 6,721,691 B2 | 4/2004 | Bao et al. | 702/189 |
| 6,738,138 B2 | 5/2004 | Wei | 356/369 |
| 6,753,961 B1 | 6/2004 | Norton et al. | 356/364 |
| 6,768,983 B1 | 7/2004 | Jakatdar et al. | 706/46 |
| 6,772,084 B2 | 8/2004 | Bischoff et al. | 702/127 |
| 6,785,638 B2 | 8/2004 | Niu et al. | 702/189 |
| 6,813,034 B2 | 11/2004 | Rosencwaig et al. | 356/601 |
| 6,819,426 B2 | 11/2004 | Sezginer et al. | 356/401 |
| 6,856,408 B2 | 2/2005 | Raymond | 356/601 |
| 6,919,964 B2 | 7/2005 | Chu | 356/601 |
| 6,928,628 B2 | 8/2005 | Seligson et al. | 716/4 |
| 6,972,852 B2 | 12/2005 | Opsal et al. | 356/625 |
| 6,974,962 B2 | 12/2005 | Brill et al. | 250/548 |
| 6,987,572 B2 | 1/2006 | Lakkapragada et al. | 356/601 |

(Continued)

OTHER PUBLICATIONS

European Search Report issued for European Patent Application No. 06253169.4-1226, dated Jun. 26, 2007.

(Continued)

*Primary Examiner*—Alan A Mathews
(74) *Attorney, Agent, or Firm*—Sterne, Kessler, Goldstein & Fox P.L.L.C.

(57) ABSTRACT

One or more focus settings for use in a device manufacturing method is determined by printing a plurality of target markers at different focus settings and using a scatterometer, e.g. off-line, to measure a property of the target markers that is indicative of focus.

14 Claims, 2 Drawing Sheets

U.S. PATENT DOCUMENTS

| | | |
|---|---|---|
| 7,046,376 B2 | 5/2006 | Sezginer .................... 356/601 |
| 7,061,615 B1 | 6/2006 | Lowe-Webb ................ 356/401 |
| 7,061,623 B2 | 6/2006 | Davidson .................... 356/497 |
| 7,061,627 B2 | 6/2006 | Opsal et al. ................. 356/601 |
| 7,068,363 B2 | 6/2006 | Bevis et al. ............. 356/237.5 |
| 2003/0002031 A1 | 1/2003 | Littau et al. ................. 356/124 |
| 2003/0048458 A1 | 3/2003 | Mieher et al. ............... 356/601 |
| 2003/0095267 A1 | 5/2003 | Mieher et al. ............... 356/614 |
| 2004/0119970 A1 | 6/2004 | Dusa et al. ............... 356/237.1 |
| 2006/0066855 A1 | 3/2006 | Den Boef et al. ........... 356/401 |
| 2006/0126074 A1 | 6/2006 | Van Der Werf et al. ..... 356/489 |
| 2006/0139592 A1 | 6/2006 | Den Boef et al. ............. 355/53 |

OTHER PUBLICATIONS

Starikov, "Exposure Monitor Structure," Integrated Circuit Metrology, Inspection, and Process Control IV (1990), SPIE vol. 1261, pp. 315-324.

Brunner et al., "Quantitative Stepper Metrology Using the Focus Monitor Test Mask," (1994), SPIE vol. 2197, pp. 541-549.

European Search Report issued for European Patent Application No. 06253169.4-2222, dated Sep. 12, 2006.

Holden, et al., "Normal Incidence Spectroscopic Ellipsometry and Polarized Reflectometry for Measurement of Photoresist Critical Dimensions," Proceedings of SPIE vol. 4689 (2002) pp. 1110-1121.

U.S. Appl. No. 10/918,742, filed Aug. 16, 2004, Arie Jeffrey Den Boef et al.

FOCUS DETERMINATION METHOD, DEVICE MANUFACTURING METHOD, AND MASK

1. FIELD

The present invention relates to a focus determination method, a device manufacturing method, and a mask.

2. BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In the manufacture of devices using lithographic processes, each mask pattern is typically projected onto the target portion in focus. In practice, this means that the target portion of the substrate is positioned in a plane of best focus of the aerial image projected by the projection system. As the critical dimension (CD), i.e. the dimension of a feature or features in which variations will cause undesirable variation in physical properties of the feature, such as the gate width of a transistor, in lithography shrinks, consistency of focus, both across a substrate and between substrates, becomes increasingly important. Traditionally, lithography apparatus have used an image sensor to probe the aerial image or optimal settings were determined by "send-ahead wafers", i.e. substrates that are exposed, developed and measured in advance of a production run. In the send-ahead wafers, test structures are exposed in a so-called focus-energy matrix (FEM) and best focus and energy settings were determined from examination of those test structures.

The use of an alignment system to monitor focus has been proposed and involves printing focus-sensitive alignment markers at known positions relative to normal alignment markers at various different focus settings, i.e. positions of the substrate relative to the projection system. The position of these focus-sensitive markers with respect to the normal alignment markers is measured and an alignment offset (AO) shows up which is representative of focus errors.

However, this method may use valuable machine time, both to print the markers and to make the alignment measurements necessary to determine the alignment offsets. Also, the method may use markers with a period matched to the alignment sensor, e.g. approximately 16 µm, which is considerably larger than the period of critical structures in a device pattern. Thus, focus settings determined as optimum for the alignment markers may not also be optimum for the device structures.

3. SUMMARY

Thus, it is desirable to provide a method for determining one or more optimum focus settings that takes up less time of a lithography apparatus and/or employs a structure with a shorter period, a device manufacturing method using the one or more optimum focus settings and a mask for use in the one or more of the methods.

According to an aspect of the invention, there is provided a method for determining one or more optimum focus settings for a device manufacturing method using a lithographic apparatus arranged to transfer a pattern from a patterning device onto a substrate, the method comprising:

printing a plurality of target markers on a substrate using the lithographic apparatus, different ones of the target markers being printed with different focus settings;

using an angle-resolved scatterometer to measure a property of the target markers; and determining the one or more focus settings based on a measured property of the target markers.

According to an aspect of the invention, there is provided a device manufacturing method using a lithographic apparatus arranged to transfer a pattern from a patterning device onto a substrate, the method comprising:

determining one or more focus settings by:
  printing a plurality of target markers on a first substrate using the lithographic apparatus, different ones of the target markers being printed with different focus settings,
  using an angle-resolved scatterometer to measure a property of the target markers, and
  determining one or more optimum focus settings based on the measured property of the target markers; and
transferring a device pattern onto a second substrate using the one or more optimum focus settings.

According to an aspect of the invention, there is provided a mask for use in a method to determine one or more focus settings for a device manufacturing method using a lithographic apparatus arranged to transfer a pattern from a patterning device onto a substrate, the mask comprising a pattern representing a target marker, the target marker sensitive to focus settings and comprises a structure having a period or scale in the range of from about 200 mm to about 1 µm and a sub-structure having a period or scale similar to that of a device feature to be printed in the device manufacturing method.

4. BRIEF DESCRIPTION OF THE DRAWINGS

Embodiments of the invention will now be described, by way of example only, with reference to the accompanying schematic drawings in which corresponding reference symbols indicate corresponding parts, and in which.

5. DETAILED DESCRIPTION

Figure 1:
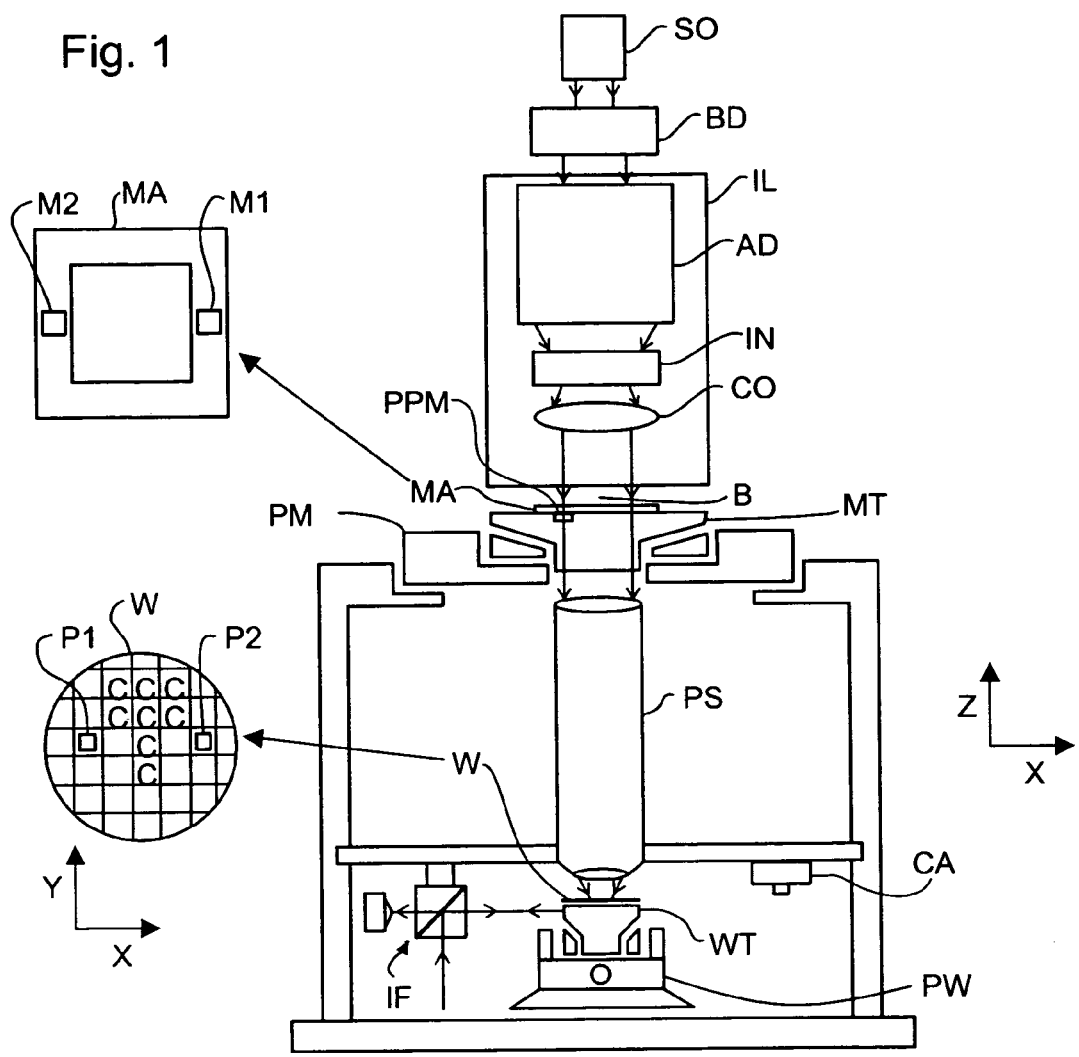
FIG. 1 depicts a lithographic apparatus according to an embodiment of the invention.

FIG. 1 schematically depicts a lithographic apparatus used in one embodiment of the invention. The apparatus comprises:

an illumination system (illuminator) IL configured to condition a radiation beam B (e.g. UV radiation or DUV radiation).

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
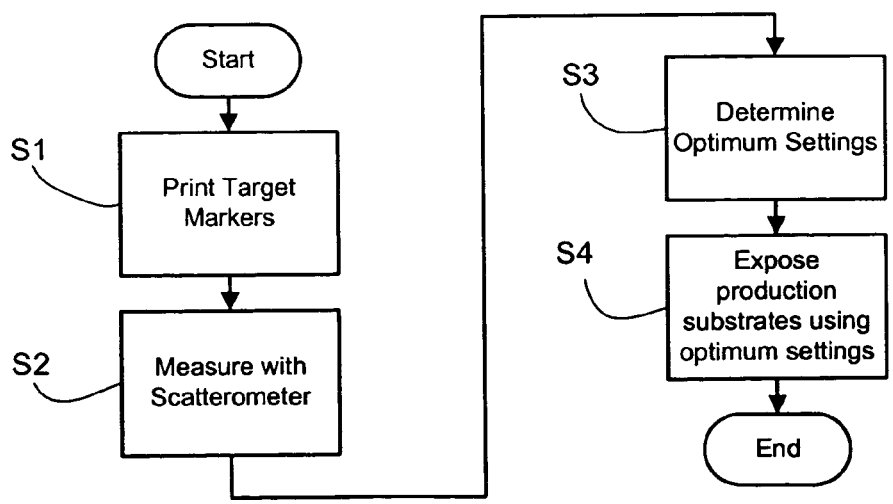
FIG. 2 depicts a method according to an embodiment of the invention.

FIG. 2 is a flow chart depicting a method according to an embodiment of the invention in which optimum focus settings for device manufacture are determined and then used to manufacture devices.

In a first step S1, a plurality of target markers are printed on a test or "send-ahead" substrate using the lithographic apparatus that is to be used subsequently for device manufacture. The target markers may comprise a main structure with a relatively large period or scale, for example in the range of from about 200 nm to about 1 μm, in particular about 500 nm, and a substructure with a relatively small scale, for example in the range of from about 25 to about 150 nm. The substructure may have a period or scale comparable to the scale of one or more of the device structures to be manufactured, for example about 50 nm or about 100 nm. In a particular embodiment, sub-structures with two different scales are included. In an embodiment, a mask may be provided that is configured to print one or more of these target markers.

The plurality of target markers are printed on the substrate with a plurality of different focus settings—several target markers may be printed at each focus setting. In particular, amongst the plurality of target markers are pairs of markers that are identical except that one is rotated by 180° relative to the other or is a mirror image of the other. Both markers of each pair are printed with the same focus settings.

The target markers are focus-sensitive meaning that if they are exposed out of focus the printed marker, either latent or developed, will differ detectably from a marker printed in focus. The target markers may be such that the degree to which the exposure was out of focus can be determined from the printed marker. In a particular embodiment, the target markers are asymmetric if printed in focus but more symmetric if printed out of focus. The markers may also be arranged so that the converse applies or they may have a more complex relationship between their degree of symmetry and the focus setting.

In step S2, a property of the printed target markers is measured using an angular-resolved scatterometer, such as that described in U.S. patent application Ser. No. 10/918,742, filed Aug. 16, 2004, which document is hereby incorporated in its entirety by reference, though other tools may also be used. The scatterometer may be an off-line or stand-alone tool or one that is integrated into a lithographic apparatus, for example the lithographic apparatus which is to be used for the device manufacture. The scatterometer may read a latent image of the target, a developed image in resist or an image that has been transferred into the substrate.

The exact form of the output of the scatterometer will depend on the form of the target marker and the property that is being measured. In some cases the scatterometer data may be used to reconstruct an image of the scattering structure, i.e. the target marker, but in many cases, in particular if asymmetry is being measured, the scatterometer output can be more simply correlated to the property being measured. In some cases the property being measured can be determined by comparing the scatterometry data to data derived from measuring one or more calibration markers.

In cases where the symmetry is the measured property, the measured asymmetry, $A_m$, of a target marker may be made up of the actual asymmetry of the target marker, $A_t$, and any systematic error of the scatterometer, $A_e$, i.e.:

$$A_m = A_t + A_e \quad (1)$$

The measured asymmetry $A'_m$ of a complementary target marker, i.e. an identical mark printed with the same focus setting but rotated by 180° or mirrored, would be expected to exhibit equal but opposite actual asymmetry and the same systematic asymmetry, i.e.:

$$A'_m = -A_t + A_e \quad (2)$$

So that by subtracting (2) from (1), it is possible to extract the actual asymmetry of the target marker.

Step S3 comprises processing the scatterometry data to determine the focus settings to be used in a device manufacturing method. In a simple case, this may comprise comparing the (actual) asymmetries determined for the marker (pairs) printed with different focus settings to identify which is the most or least asymmetric. In some cases the optimum settings may be determined by interpolating between or extrapolating from the measured results. At step S4, the focus settings may then be used to expose production substrates using the same lithography apparatus through which the test or "send-ahead" substrate was processed.

Figure 3A:
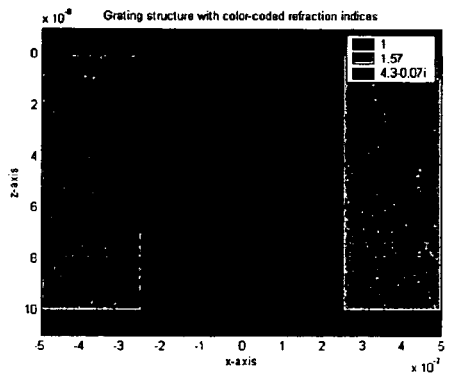
FIGS. 3A, 3B, 4A, 4B, 5A and 5B depict target patterns imaged at different focus settings and the corresponding response of a scatterometer.
Figure 3B:
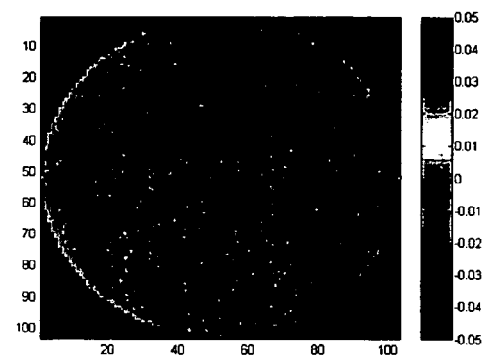
Figure 4A:
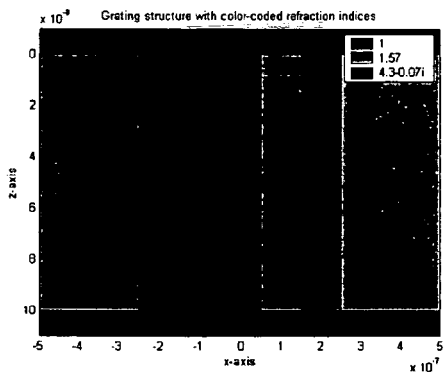
Figure 4B:
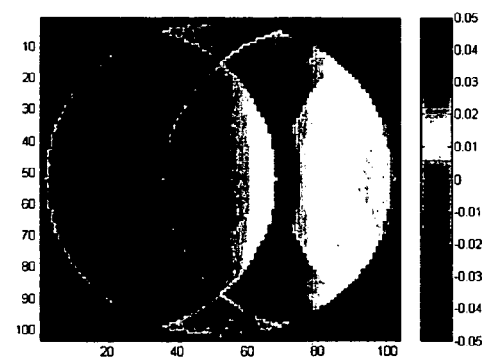
Figure 5A:
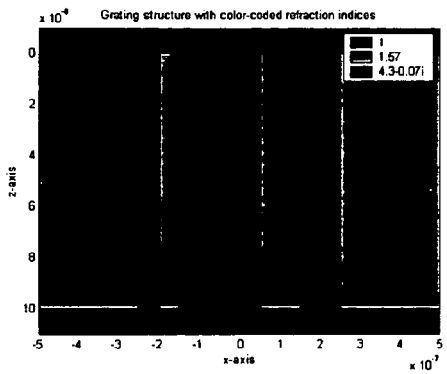
Figure 5B:
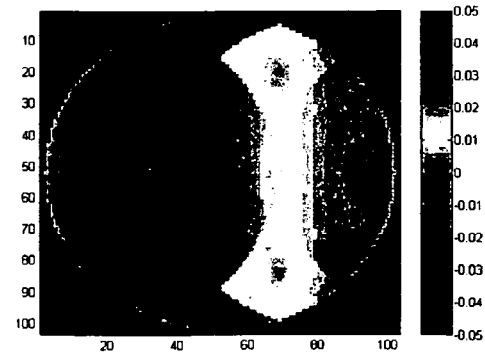

The operation of an embodiment of the invention is explained below with reference to FIGS. 3 to 5. A target marker comprising a 500 nm trench with 100 nm and 50 nm lines in it is imaged onto a substrate at three different focus settings and the resultant structures are shown in cross-section in FIGS. 3A, 4A and 5A. The corresponding scatterometer outputs are shown in FIGS. 3B, 4B and 5B. In FIG. 3A the image is very out of focus so that the 100 nm and 50 nm lines are not resolved at all. The structure on the substrate therefore consists of two opaque regions of 100 nm height, either side of a trench 500 nm wide. In FIG. 4A the image is near focus so that the 100 nm line, offset by 50 nm from the center of the trench, is resolved but not the 50 nm line. In FIG. 5A both lines are resolved. The 50 nm line is 50 nm from the side of the trench, on the opposite side than the 100 nm line. The differences in the corresponding scatterometer outputs can be clearly seen in FIGS. 3B, 4B and 5B. FIG. 3B. shows a symmetric response that is substantially constant with a circular region and zero outside. FIG. 4B shows a pattern of overlapping offset circles with a strong asymmetry—a higher intensity on the side corresponding to the 100 nm line. FIG. 5B shows a similar pattern of overlapping circles but with a lesser amount of asymmetry. These can easily be distinguished by simple criteria, e.g. by measuring the asymmetry and/or the spatial frequencies in the scatterometer response.

The focus settings determined using the method according to an embodiment of the invention may be more optimum than those determined using prior art techniques because the markers used can be arranged to be similar to a device structure and have similar through-focus behavior. Thus the focus settings that are determined to be optimum for the test markers should also be optimum for a device structure.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

The invention claimed is:

1. A method for determining an optimum focus setting for a device manufacturing method using a lithographic apparatus arranged to transfer a pattern from a patterning device onto a substrate, comprising:
    printing a plurality of target markers on a substrate using the lithographic apparatus, different ones of the target markers being printed with different focus settings, wherein the target markers includes pairs of markers that are identical in form, but rotated by 180° with respect to each other;
    using an angle-resolved scatterometer to measure a property of the target markers; and
    determining the optimum focus setting based on a measured property of the target markers, including subtracting a measurement of the measured property of a first target marker of a respective one of the pairs of markers from a measurement of the measured property of a second target marker of the respective one of the pairs of markers.

2. The method according to claim 1, wherein the target markers comprise a structure having a period or scale in the range of from about 200 nm to about 1 µm and a sub-structure having a period or scale similar to that of a device feature to be printed in the device manufacturing method.

3. The method according to claim 2, wherein the period or scale of the sub-structure is in the range of from about 25 nm to about 150 nm.

4. The method according to claim 2, wherein the sub-structure has two distinct and different periods.

5. The method according to claim 1, wherein the property is related to an asymmetry of the target markers.

6. A device manufacturing method using a lithographic apparatus arranged to transfer a pattern from a patterning device onto a substrate, comprising:
    determining a focus setting by:
        printing a plurality of target markers on a first substrate using the lithographic apparatus, different ones of the target markers being printed with different focus settings, wherein the target markers include pairs of markers that are identical in form, but rotated by 180° with respect to each other,
        using an angle-resolved scatterometer to measure a property of the target markers, and
        determining an optimum focus setting based on the measured property of the target markers including subtracting a measurement of the measured property of a first target marker a respective one of the pairs of markers from a measurement of the measured property of a second target marker of the respective one of the pairs of markers; and transferring a device pattern onto a second substrate using the optimum focus setting.

7. The method according to claim 6, wherein the target markers comprise a structure having a period or scale in the range of from about 200 nm to about 1 μm and a sub-structure having a period or scale similar to that of a device feature to be printed in the device manufacturing method.

8. The method according to claim 7, wherein the period or scale of the sub-structure is in the range of from about 25 nm to about 150 nm.

9. The method according to claim 7, wherein the sub-structure has two distinct and different periods.

10. The method according to claim 6, wherein the property is related to an asymmetry of the target markers.

11. A mask for use in a method to determine a focus setting for a device manufacturing method using a lithographic apparatus arranged to transfer a pattern from a patterning device onto a substrate, the mask comprising a pattern representing a target marker, the target marker sensitive to focus settings and comprises a structure having a period in the range of from about 200 nm to about 1 μm and a sub-structure having a period similar to that of a device feature to be printed in the device manufacturing method.

12. The mask according to claim 11, wherein the period or scale of the sub-structure is in the range of from about 25 nm to about 150 nm.

13. The mask according to claim 11, wherein the sub-structure has two distinct and different periods.

14. The mask according to claim 11, wherein the mask comprises a pattern representing a pair of target markers that are identical in form but rotated by 180° with respect to each other or mirror images of one another.

* * * * *